United States Patent
Kim et al.

(10) Patent No.: US 10,236,328 B2
(45) Date of Patent: Mar. 19, 2019

(54) METHOD OF MANUFACTURING ORGANIC LIGHT-EMITTING DISPLAY DEVICE

(71) Applicant: SAMSUNG DISPLAY CO., LTD., Yongin-si, Gyeonggi-do (KR)

(72) Inventors: Jaesik Kim, Yongin-si (KR); Yeonhwa Lee, Yongin-si (KR); Joongu Lee, Yongin-si (KR); Sehoon Jeong, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/831,829

(22) Filed: Dec. 5, 2017

(65) Prior Publication Data
US 2018/0277612 A1    Sep. 27, 2018

(30) Foreign Application Priority Data
Mar. 23, 2017 (KR) .................. 10-2017-0036921

(51) Int. Cl.
*H01L 27/32* (2006.01)
*H01L 51/52* (2006.01)
*H01L 51/00* (2006.01)

(52) U.S. Cl.
CPC ...... *H01L 27/3248* (2013.01); *H01L 27/3211* (2013.01); *H01L 51/004* (2013.01);
(Continued)

(58) Field of Classification Search
CPC ............ H01L 27/3248; H01L 27/3211; H01L 51/5253; H01L 51/004; H01L 51/56
See application file for complete search history.

(56) References Cited

U.S. PATENT DOCUMENTS

| 8,513,038 B2 | 8/2013 | Moriyama et al. |
| 9,054,341 B2 | 6/2015 | Kim et al. |

(Continued)

FOREIGN PATENT DOCUMENTS

| JP | 2013-114805 A | 6/2013 |
| JP | 2014-232568 A | 12/2014 |

(Continued)

OTHER PUBLICATIONS

Barry Arkles, Silane Coupling Agents Connecting Across Boundaries, (3ed Edition), Gelest, Inc, Morrisville, PA.

*Primary Examiner* — Jay C Chang
*Assistant Examiner* — Mikka Liu
(74) *Attorney, Agent, or Firm* — Lee & Morse P.C.

(57) ABSTRACT

A method of manufacturing an organic light-emitting display device includes forming pixel electrodes on a substrate, forming a first protective layer with a first exposure portion that exposes a first pixel electrode of the pixel electrodes, forming on the first pixel electrode a first intermediate layer and a first blocking layer covering the first intermediate layer, removing the first protective layer, forming a second protective with a second exposure portion that exposes a second pixel electrode of the pixel electrodes, forming on the first pixel electrode a second intermediate layer and a second blocking layer covering the second intermediate layer, removing the second protective layer, forming a third protective with a third exposure portion that exposes a third pixel electrode of the pixel electrodes, and forming a third intermediate layer on the third pixel electrode, wherein each of the first and second blocking layers includes a self-assembled monolayer.

11 Claims, 10 Drawing Sheets

(52) U.S. Cl.
CPC ...... *H01L 51/0094* (2013.01); *H01L 51/5253* (2013.01); *H01L 2227/323* (2013.01)

(56) References Cited

U.S. PATENT DOCUMENTS

| | | | | |
|---|---|---|---|---|
| 2008/0146011 | A1* | 6/2008 | Yoon | B82Y 30/00 |
| | | | | 438/584 |
| 2010/0289019 | A1 | 11/2010 | Katz et al. | |
| 2014/0120645 | A1* | 5/2014 | Paek | H01L 27/3211 |
| | | | | 438/35 |
| 2017/0256754 | A1* | 9/2017 | Defranco | H01L 51/56 |

FOREIGN PATENT DOCUMENTS

| | | |
|---|---|---|
| KR | 10-2014-0082089 A | 7/2014 |
| KR | 10-1677024 B1 | 11/2016 |
| WO | WO 2016/153230 A1 | 9/2016 |

\* cited by examiner

METHOD OF MANUFACTURING ORGANIC LIGHT-EMITTING DISPLAY DEVICE

CROSS-REFERENCE TO RELATED APPLICATION

Korean Patent Application No. 10-2017-0036921, filed on Mar. 23, 2017, in the Korean Intellectual Property Office, and entitled: "Method Of Manufacturing Organic Light-Emitting Display Device," is incorporated by reference herein in its entirety.

BACKGROUND

1. Field

One or more embodiments relate to a method of manufacturing an organic light-emitting display device.

2. Description of the Related Art

An organic light-emitting display device, which is a self-emissive display device, does not require a separate light source. Thus, the organic light-emitting display device may be driven by low voltage, may be configured as a lightweight thin type display device, and is gaining attention as a next-generation display device due to high-quality characteristics, e.g., a wide viewing angle, a high contrast ratio, and a high response speed.

SUMMARY

According to one or more embodiments, a method of manufacturing an organic light-emitting display device may include forming a plurality of pixel electrodes on a substrate, forming a first protective layer over the plurality of pixel electrodes, such that a first exposure portion through the first protective layer exposes a first pixel electrode of the plurality of pixel electrodes, forming a first intermediate layer and a first blocking layer on the first pixel electrode, such that the first blocking layer covers the first intermediate layer, removing the first protective layer, forming a second protective layer over the plurality of pixel electrodes, such that a second exposure portion through the second protective layer exposes a second pixel electrode of the plurality of pixel electrodes, forming a second intermediate layer and a second blocking layer on the second pixel electrode, such that the second blocking layer covers the second intermediate layer, removing the second protective layer, forming a third protective layer over the plurality of pixel electrodes, such that a third exposure portion through the third protective layer exposes a third pixel electrode of the plurality of pixel electrodes, and forming a third intermediate layer on the third pixel electrode, wherein each of the first blocking layer and the second blocking layer includes a self-assembled monolayer.

In the present embodiment, the self-assembled monolayer may include a chain including at least one of a fluorine-based polymer and a hydrocarbon-based polymer, and a head group including an organic-inorganic silane compound.

In the present embodiment, the fluorine-based polymer may include at least one of perfluoropolyether, vinylidene fluoride, tetrafluoroethylene, hexafluoropropylene, and chlorotrifluoroethylene, and the hydrocarbon-based polymer may include at least one of octadecyltrichloro and dichlorodimethyl.

In the present embodiment, the organic-inorganic silane compound may include at least one functional group from among an amino group, a vinyl group, an epoxy group, an alkoxy group, a halogen group, a mercapto group, and a sulfide group.

In the present embodiment, the forming of the first blocking layer and the second blocking layer may include vacuum-depositing a blocker on each of the first intermediate layer and the second intermediate layer, the blocker formed by polymerizing and condensing the at least one of the fluorine-based polymer and the hydrocarbon-based polymer with the organic-inorganic silane compound.

In the present embodiment, the first exposure portion may be formed by coating the first protective layer with a first photosensitive resin layer, forming a first groove by partially exposing and etching the first photosensitive resin layer, and then etching the first protective layer via the first groove.

In the present embodiment, a size of the first exposure portion may be greater than that of the first groove.

In the present embodiment, the method may further include removing the third protective layer and the first and second blocking layers.

In the present embodiment, the method may further include forming an opposite electrode on the first intermediate layer, the second intermediate layer, and the third intermediate layer.

In the present embodiment, the method may further include forming a thin film encapsulation layer on the opposite electrode.

In the present embodiment, a plurality of thin film transistors electrically connected to the plurality of pixel electrodes may be formed above the substrate.

In the present embodiment, forming the first protective layer may include forming the first exposure portion to expose only the first pixel electrode, while the second and third pixel electrodes are covered by the first protective layer

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
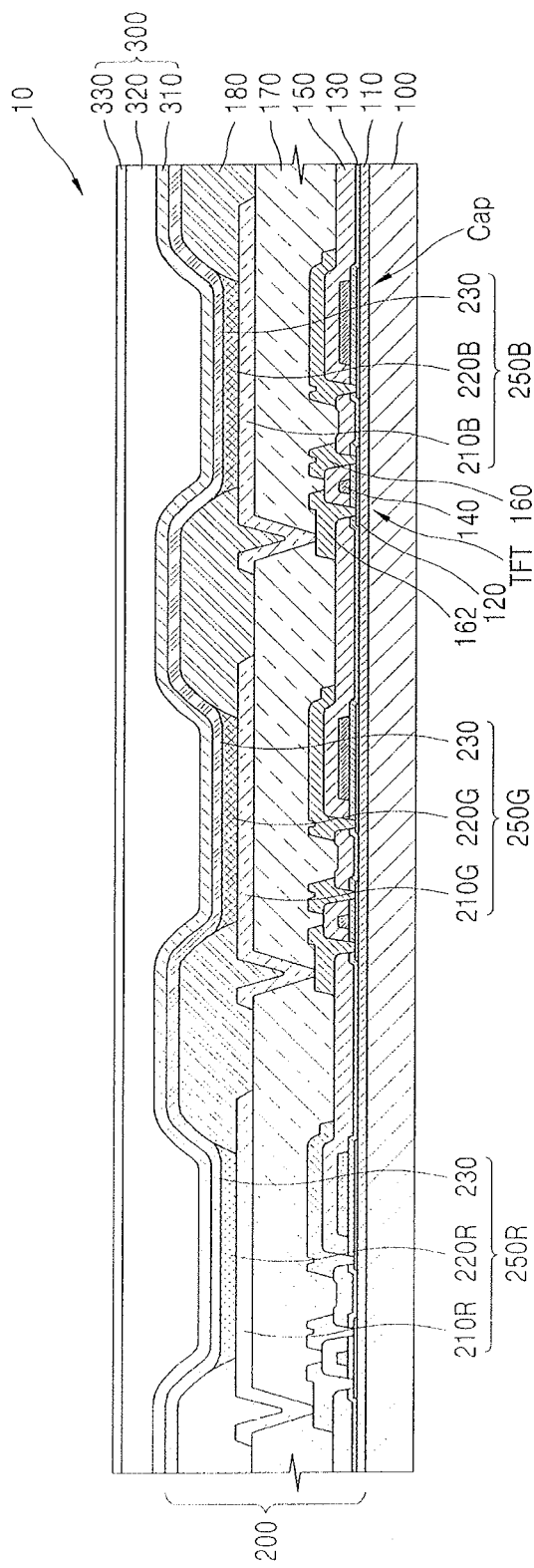
FIG. 1 illustrates a schematic cross-sectional view of an example of an organic light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

While such terms as "first" and "second" may be used to describe various components, such components must not be limited to the above terms. The above terms are used only to distinguish one component from another.

The singular forms "a," "an," and "the" used herein are intended to include the plural forms as well, unless the context clearly indicates otherwise. Further, it will be understood that terms such as "include," "comprise," and "have" used herein specify the presence of stated features or components, but do not preclude the presence or addition of one or more other features or components.

When an embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of an example of an organic light-emitting display device 10 according to an embodiment. FIGS. 2 to 10 are schematic cross-sectional views of stages in a method of manufacturing the organic light-emitting display device 10 of FIG. 1.

Referring to FIGS. 1 to 10, a method of manufacturing the organic light-emitting display device 10, according to an embodiment, may include preparing a substrate 100 with a plurality of pixel electrodes 210R, 210G, and 210B, and using a first protective layer 410 including a first exposure portion 412, which exposes a first pixel electrode 210R from among the plurality of pixel electrodes 210R, 210G, and 210B, to form a first intermediate layer 220R and a first blocking layer 291 covering the first intermediate layer 220R over the first pixel electrode 210R. The method may further include removing the first protective layer 410, and by using a second protective layer 420 including a second exposure portion 414 which exposes a second pixel electrode 210G from among the pixel electrodes 210R, 210G, and 210B, forming, over the second pixel electrode 210G, a second intermediate layer 220G and a second blocking layer 293 covering the second intermediate layer 220G. The method may further include removing the second protective layer 420, and by using a third protective layer 430 including a third exposure portion 416 which exposes a third pixel electrode 210B from among the pixel electrodes 210R, 210G, and 210B, forming a third intermediate layer 220B on the third pixel electrode 210B.

After the third intermediate layer 220B is formed, the third protective layer 430 and the first and second blocking layers 291 and 293 may be removed, and an opposite electrode 230 may be formed on the first intermediate layer 220R, the second intermediate layer 220G, and the third intermediate layer 220B. The pixel electrodes 210R, 210G, and 210B may be respectively electrically connected to a plurality of thin film transistors TFT formed above the substrate 100, and a plurality of capacitors Cap may be formed above the substrate 100 together with the plurality of thin film transistors TFT. Each of the thin film transistors TFT may include an active layer 120, a gate electrode 140, a source electrode 160, and a drain electrode 162.

In detail, referring to FIGS. 1-2, formation of the thin film transistors TFT and the pixel electrodes 210R, 210G, and 210B electrically connected to the thin film transistors TFT on the substrate 100 will be described first.

The substrate 100 may include a transparent glass material, e.g., mainly composed of $SiO_2$. However, the substrate 100 is not limited thereto, and may include a transparent plastic material. The plastic material used to form the substrate 100 may be an insulating organic material, and may be at least one of, e.g., polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and cellulose acetate propionate (CAP).

In a bottom emission type, i.e., where an image is implemented toward the substrate 100, the substrate 100 needs to include a transparent material. However, in a top emission type, i.e., where an image is implemented in an opposite direction to the substrate 100, the substrate 100 does not need to include a transparent material. In this case, the substrate 100 may include metal. When the substrate 100 includes metal, the substrate 100 may include, but is not limited to, at least one of, e.g., carbon, steel, chromium (Cr), manganese (Mn), nickel (Ni), titanium (Ti), molybdenum (Mo), and stainless steel (SUS).

Figure 2:
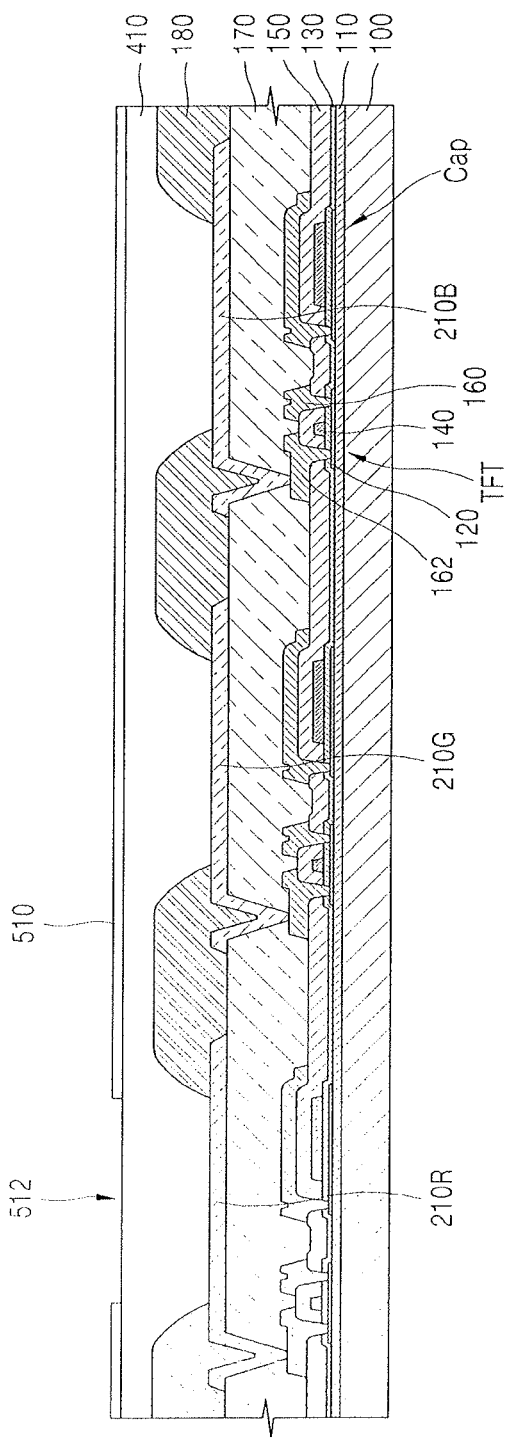
FIGS. 2 to 10 illustrate schematic cross-sectional views of stages in a method of manufacturing the organic light-emitting display device of FIG. 1.

As illustrated I FIG. 2, a buffer layer 110 may be formed on the substrate 100 to prevent intrusion of impurities, etc. into the active layer 120 of a thin film transistor TFT. The buffer layer 110 may include an inorganic material, e.g., silicon oxide, silicon nitride, silicon oxynitride, aluminum oxide, aluminum nitride, titanium oxide, or titanium nitride, or an organic material, e.g., PI, polyester, or acryl, or may have a stack structure of these materials. The buffer layer 110 may be deposited by using various deposition methods, e.g., a plasma-enhanced chemical vapor deposition (PECVD) method, an atmospheric pressure CVD (APCVD) method, or a low pressure CVD (LPCVD) method.

The active layer 120 including an inorganic semiconductor, e.g., silicon, an organic semiconductor, or an oxide semiconductor material may be formed on the buffer layer 110. The active layer 120 has a source region, a drain region, and a channel region therebetween. For example, when the active layer 120 is formed by using amorphous silicon, an amorphous silicon layer is formed on the entire surface of the substrate 100 and then crystallized to form a polycrystalline silicon layer. After the polycrystalline silicon layer is patterned, a source region and a drain region at opposite edges thereof are doped with impurities to form the active layer 120 including a source region, a drain region, and a channel region between the doped source and drain regions.

A gate insulating film 130 may be formed on the active layer 120. The gate insulating film 130, which insulates the active layer 120 and the gate electrode 140 from each other, may include, e.g., $SiN_x$ or $SiO_2$.

The gate electrode 140 may be formed above the active layer 120 with the gate insulating film 130 therebetween. The gate electrode 140 may be formed of at least one of, e.g., aluminum (Al), platinum (Pt), palladium (Pd), silver (Ag), magnesium (Mg), gold (Au), Ni, neodymium (Nd), iridium (Ir), Cr, lithium (Li), calcium (Ca), Mo, Ti, tungsten (W), and copper (Cu), in a single layer or a multilayer structure.

An interlayer insulating film 150 may be formed on the gate electrode 140. The interlayer insulating film 150 may be formed of, e.g., silicon oxide or silicon nitride, in a single layer or a multilayer structure.

The source electrode 160 and the drain electrode 162 are formed on the interlayer insulating film 150 to finalize the thin film transistor TFT. In detail, the interlayer insulating film 150 and the gate insulating film 130 expose the source region and the drain region of the active layer 120. The source electrode 160 and the drain electrode 162 contact the exposed source and drain regions of the active layer 120, respectively. The source electrode 160 and the drain electrode 162 may be formed of at least one of, e.g., Al, Pt, Pd, Ag, Mg, Au, Ni, Nd, Ir, Cr, Li, Ca, Mo, Ti, W, and Cu, in a single layer or a multilayer structure.

Although FIG. 1 illustrates a top gate-type thin film transistor TFT sequentially including the active layer 120, the gate electrode 140, the source electrode 160, and the drain electrode 162, the present disclosure is not limited thereto. For example, the gate electrode 140 may be disposed below the active layer 120.

A first insulating film 170 may be formed on the source electrode 160 and the drain electrode 162, e.g., to cover a plurality of thin film transistors TFT on the substrate 100. When an organic light-emitting device is disposed above the thin film transistor TFT, the first insulating film 170 may planarize an upper surface of the thin film transistor TFT and may protect the thin film transistors TFT and various devices. The first insulating film 170 may include an inorganic insulating film and/or an organic insulating film. The inorganic insulating film may include, e.g., $SiO_2$, $SiN_x$, SiON, $Al_2O_3$, $TiO_2$, $Ta_2O_5$, $HfO_2$, $ZrO_2$, BST, or PZT. The organic insulating film may include, e.g., a commodity polymer (PMMA or PS), polymer derivatives containing a phenol-based group, an acrylic polymer, an imide-based polymer, an aryl ether-based polymer, an amide-based polymer, a fluorine-based polymer, a p-xylene-based polymer, a vinyl alcohol-based polymer, or a blend thereof. Also, the first insulating film 170 may be a complex stack of an inorganic insulating film and an organic insulating film.

Organic light-emitting devices including a first sub-pixel 250R, a second sub-pixel 250G, and a third sub-pixel 250B may be formed on the first insulating film 170. For example, the first sub-pixel 250R may be a red sub-pixel, the second sub-pixel 250G may be a green sub-pixel, and the third sub-pixel 250B may be a blue sub-pixel. The first sub-pixel 250R may include the first pixel electrode 210R, the first intermediate layer 220R, and the opposite electrode 230, the second sub-pixel 250G may include the second pixel electrode 210G, the second intermediate layer 220G, and the opposite electrode 230, and the third sub-pixel 250B may include the third pixel electrode 210B, the third intermediate layer 220B, and the opposite electrode 230.

In detail, as illustrated in FIG. 2, the first to third pixel electrodes 210R, 210G, and 210B may be formed on the first insulating film 170, may be respectively connected to the thin film transistors TFT via contact holes formed in the first insulating film 170, and may be transparent electrodes or reflective electrodes. When the first to third pixel electrodes 210R, 210G, and 210B are transparent electrodes, the first to third pixel electrodes 210R, 210G, and 210B may include, e.g., ITO, IZO, ZnO, $In_2O_3$, IGO, or AZO. When the first to third pixel electrodes 210R, 210G, and 210B are reflective electrodes, the first to third pixel electrodes 210R. 210G, and 210B may include a reflective film including, e.g., Ag, Mg, Al, Pt, Pd, Au, Ni, Nd, Ir, Cr, or a compound thereof, and a layer including, e.g., ITO, IZO, ZnO, $In_2O_3$, IGO, or AZO. However, the present disclosure is not limited thereto. The first to third pixel electrodes 210R, 210G, and 210B may include various materials, and a structure thereof may also be variously modified so that the first to third pixel electrodes 210R, 210G, and 210B may have, for example, a single layer or multi-layer structure.

A second insulating film 180 may be formed on the first to third pixel electrodes 210R, 210G, and 210B. The second insulating film 180 may include at least one organic insulating material of, e.g., PI, polyamide, an acrylic resin layer, benzocyclobutene, and a phenol resin layer, and may be formed by, e.g., spin coating. The second insulating film 180 may be a pixel-defining film exposing predetermined regions of the first to third pixel electrodes 210R, 210G, and 210B.

The first intermediate layer 220R, the second intermediate layer 220G, and the third intermediate layer 220B respectively included in the first sub-pixel 250R, the second sub-pixel 250G, and the third sub-pixel 250B may be formed in pixel regions defined by the second insulating film 180, and may respectively include emission layers (EMLs) respectively emitting red colored light, green colored light, and blue colored light. In addition, the first intermediate layer 220R, the second intermediate layer 220G, and the third intermediate layer 220B may include a hole injection layer (HIL), a hole transport layer (HTL), an electron transport layer (ETL), an electron injection layer (EIL), and the like stacked in a single or complex structure, and may have various structures. Also, a metal film including, e.g., Ag and Mg, may be included on top of the first intermediate layer 220R, the second intermediate layer 220G, and the third intermediate layer 220B.

Hereinafter, a method of forming the first intermediate layer 220R, the second intermediate layer 220G, and the third intermediate layer 220B above the pixel electrodes 210R, 210G, and 210B, respectively, will be described in more detail below with reference to FIGS. 2-3.

First, referring to FIG. 2, the first protective layer 410 may be formed above the substrate 100 so as to cover the, e.g., entire, second insulating film 180 and, e.g., all, the exposed portions of the pixel electrodes 210R, 210G, and 210B. Next, a first photosensitive resin layer 510 may be formed on the top surface of the first protective layer 410, and a first groove 512 may be formed through the first photosensitive resin layer 510 in a region overlapping the first pixel electrode 210R.

Figure 3:
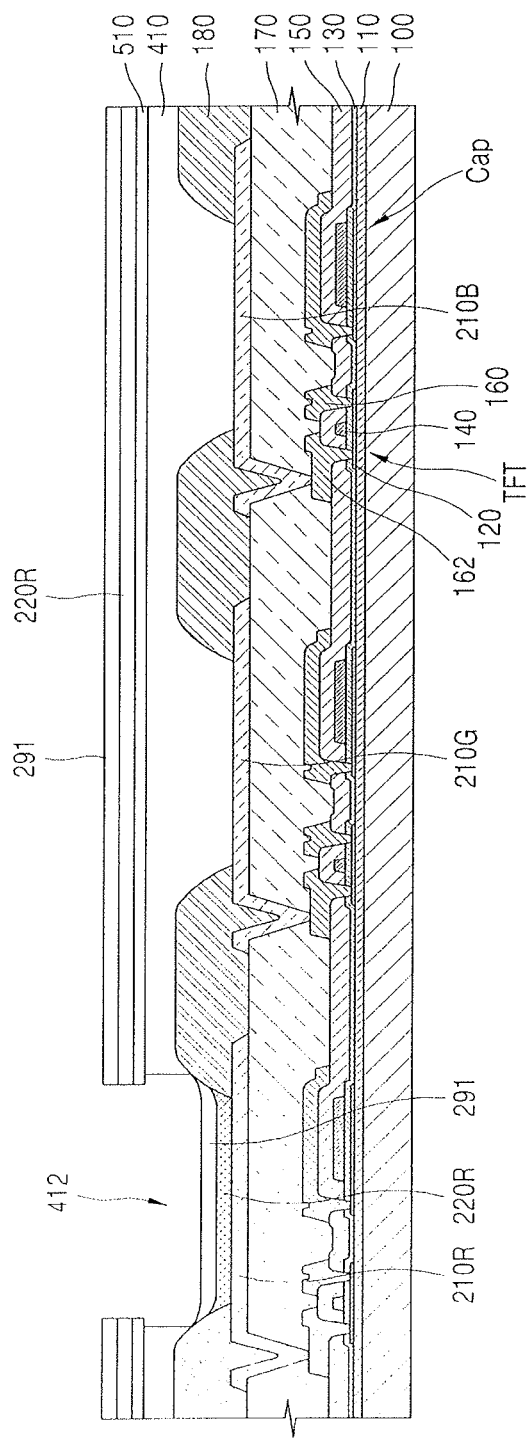

Referring to FIG. 3, the first exposure portion 412 exposing the first pixel electrode 210R may be formed through the first protective layer 410. Then, the first intermediate layer 220R and the first blocking layer 291 may be, e.g., sequentially, formed over the first pixel electrode 210R.

The first protective layer 410 may cover not only the pixel electrodes 210R, 210G, and 210B but also the second insulating film 180. For example, the first protective layer 410 may include a fluorine-based resin. That is, the first protective layer 410 is unreactive with an organic material, and thus may be prevented from reacting with the second insulating film 180 including an organic material. For example, the first protective layer 410 may include, but is not limited to, 75 wt % to 95 wt % of fluoro ether having hydrogen partially substituted with fluorine in an ether structure, and 5 wt % to 25 wt % of resin polymer.

The first exposure portion 412 may be formed by coating the first protective layer 410 with the first photosensitive resin layer 510, forming the first groove 512 by partially exposing and etching the first photosensitive resin layer 510, and then etching the first protective layer 410 via the first groove 512. The first exposure portion 412 may be formed by wet-etching the first protective layer 410 by using a stripper capable of selectively removing the first protective layer 410. For example, the first exposure portion 412 may be formed by removing the first protective layer 410 exposed via the first groove 512 by using a stripper in the form of a solution including hydro fluoro ether. As described above, the first exposure portion 412 may be formed by wet etching, and thus, a size of the first exposure portion 412 may be greater than that of the first groove 512, as illustrated in FIG. 3.

The first intermediate layer 220R may be formed by a thermal deposition method, etc., so as to correspond to the entire area of the substrate 100. Accordingly, the first intermediate layer 220R may be formed not only on the first pixel electrode 210R but also on the first photosensitive resin layer 510. For example, a plurality of first intermediate layers 220R may be formed, e.g., simultaneously, on a plurality of corresponding first pixel electrodes 210R, while the second and third pixel electrodes 210G and 210B are covered by the first protective layer 410 (FIG. 3). For example, a plurality of first blocking layers 291 may be formed, e.g., simultaneously, on a plurality of corresponding first intermediate layers 220R, while the second and third pixel electrodes 210G and 210B are covered by the first protective layer 410 (FIG. 3).

The first intermediate layer 220R may include an EML, and may have an HIL, an HTL, an ETL, an EIL, and the like stacked in a single or complex structure. Also, a metal film including, e.g., Ag and Mg, may further be included on top of the first intermediate layer 220R.

The first blocking layer 291 may cover the, e.g., entire exposed surface of the, first intermediate layer 220R. The first blocking layer 291 may be formed by a vapor deposition method. The first blocking layer 291 may be formed not only on the first intermediate layer 220R in the first exposure portion 412, but also on the first intermediate layer 220R on the first photosensitive resin layer 510. Since the first exposure portion 412 is larger, e.g., wider along a direction parallel to the substrate 100, than the first groove 512, the first blocking layer 291 formed by the vapor deposition method may be deposited in a direction perpendicular to the substrate 100 and a direction oblique to the substrate 100, and thus may cover edges of the first intermediate layer 220R in the first exposure portion 412 having a width greater than that of the first groove 512. For example, as illustrated in FIG. 3, the first blocking layer 291 may extend to completely overlap and cover the upper surface of the first intermediate layer 220R, and may extend beyond edges of the first intermediate layer 220R to contact sidewalls of the second insulating film 180, e.g., so the first intermediate layer 220R may be completely enclosed by the first blocking layer 291, the first pixel electrode 210R, and the second insulating film 180.

The first blocking layer 291 may block exposure of the first intermediate layer 220R to a process environment during a process of forming the second intermediate layer 220G (of FIG. 1) and the third intermediate layer 220B (of FIG. 1), which will be described later, and thus may prevent damage to the first intermediate layer 220R. For example, as the first blocking layer 291 may completely cover the first intermediate layer 220R, the first intermediate layer 220R may be protected from any damage during subsequent processing stages, e.g., stages forming the second and third intermediate layers 220G and 220B.

Therefore, the first blocking layer 291 according to embodiments exhibits excellent binding strength with respect to the second protective layer 420 (of FIG. 5) and the third protective layer 430 (of FIG. 8) formed thereon during subsequent processes, and is stably maintained when the first protective layer 410, the second protective layer 420 (of FIG. 5), and the third protective layer 430 (of FIG. 8) are removed. At the same time, the first blocking layer 291 is easily removed from the first intermediate layer 220R without residue remaining on the first intermediate layer 220R after the second intermediate layer 220G (of FIG. 1) and the third intermediate layer 220B (of FIG. 1) are formed.

That is, a first side, i.e., surface, of the first blocking layer 291 facing the first intermediate layer 220R and a second side, i.e., surface, opposite the first side of the first blocking layer 291 have different characteristics from each other. Accordingly, the first blocking layer 291 may be a self-assembled monolayer. For example, the first blocking layer 291 may be a self-assembled monolayer including a chain, e.g., at least one of a fluorine-based polymer and a hydrocarbon-based polymer to have water repellency, and a terminal group, e.g., a head group of the polymer chain including an organic-inorganic silane compound binding to the first intermediate layer 220R.

Figure 8:
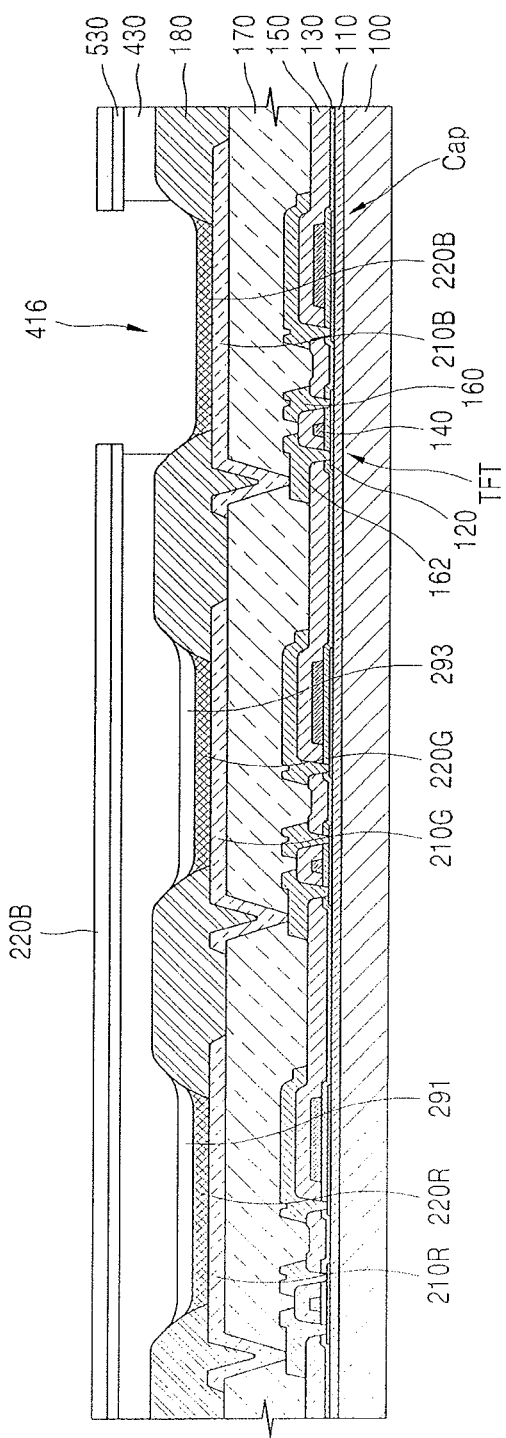

The fluorine-based polymer and the hydrocarbon-based polymer have low surface energy and thus may have excellent binding strength with respect to the second protective layer 420 (of FIG. 5) and the third protective layer 430 (of FIG. 8). For example, the fluorine-based polymer may include at least one of perfluoropolyether, vinylidene fluoride, tetrafluoroethylene, hexafluoropropylene, and chlorotrifluoroethylene, and the hydrocarbon-based polymer may include at least one of octadecyltrichloro and dichlorodimethyl, but the present disclosure is not limited thereto.

The organic-inorganic silane compound may perform condensation and polymerization reactions with the fluorine-based polymer and/or the hydrocarbon-based polymer, and may include an adhesion promoter for increasing adhesive strength with respect to the first intermediate layer 220R. For example, the organic-inorganic silane compound may have at least one functional group from among an amino group, a vinyl group, an epoxy group, an alkoxy group, a halogen group, a mercapto group, and a sulfide group.

In detail, the organic-inorganic silane compound may include at least one of aminopropyltriethoxysilane, aminopropyltrimethoxysilane, amino-methoxysilane, phenylaminopropyltrimethoxysilane, N-(2-aminoethyl)-3-aminopropyltrimethoxysilane, N-(β-aminoethyl)-γ-aminopropylmethyldimethoxysilane, γ-aminopropyltridimethoxysilane, γ-aminopropyldimethoxysilane,γ-aminopropyltriethoxysilane, γ-aminopropyldiethoxysilane, vinyltriethoxysilane, vinyltrimethoxysilane, vinyltri(methoxyethoxy)silane, di-, tri- or tetraalkoxysilane, vinylmethoxysilane, vinyltrimethoxysilane, vinylepoxysilane, vinyltriepoxysilane, 3-glycidoxypropyltrimethoxysilane, 3-methacryloxypropyltrimethoxysilane, γ-glycidoxypropyltriethoxysilane, γ-methacryloxypropyltrimethoxysilane, chlorotrimethylsilane, trichloroethylsilane, trichloromethylsilane, trichlorophenylsilane, trichlorovinylsilane, mercaptopropyltriethoxysilane, trifluoropropyltrimethoxysilane, bis(trimethoxysilylpropyl)amine, bis(3-triethoxysilylpropyl)tetrasulfide, bis(triethoxysilylpropyl)disulfide, (methacryloxy)propyltrimethoxysilane, 2-(3,4-epoxycyclohexyl)ethyltrimethoxysilane, 3-glycidoxypropylmethyldiethoxysilane, 3-glycidoxypropyldiethoxysilane, 3-glycidoxypropyltriethoxysilane, and p-styryltrimethoxysilane.

The first blocking layer 291 may be formed by mixing at least one of the fluorine-based polymer and the hydrocarbon-based polymer with the organic-inorganic silane compound, forming a blocker for forming the first blocking layer 291 by polymerizing and condensing at least one of the fluorine-based polymer and the hydrocarbon-based polymer with the organic-inorganic silane compound in an inactive gas atmosphere, e.g., argon gas, and then vacuum-depositing the blocker. The formed first blocking layer 291 may include at least one of, e.g., FOTS($CF_3(CF_2)_5(CH_2)_2SiCl_3$), FDTS ($CF_3(CF_2)_7(CH_2)_2SiCl_3$), FOMDS($CF_3(CF_2)_5(CH_2)_2Si(CH_3)Cl_2$), FOMMS($CF_3(CF_2)_5(CH_2)_2Si(CH_3)_2Cl$), OTS ($CH_3(CH_2)_{17}(CH_2)_2SiCl_3$), and DDMS(($CH_3)_2SiCl_2$).

Figure 4:
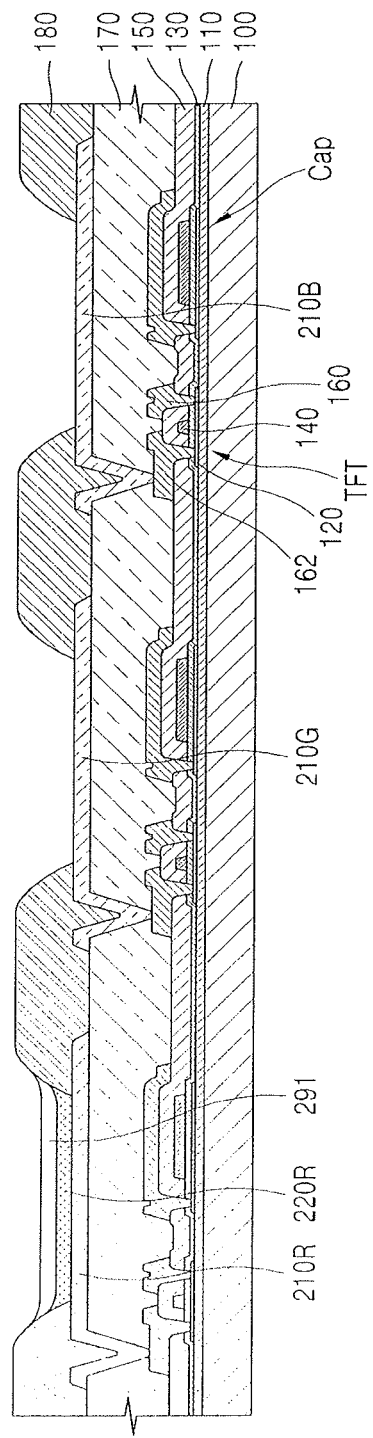

As illustrated in FIG. 4, after the first blocking layer 291 is formed, the first protective layer 410 (of FIG. 3) is removed. The first protective layer 410 (of FIG. 3) may be removed by a stripper capable of selectively removing only the first protective layer 410 (of FIG. 3). For example, the first protective layer 410 (of FIG. 3) may be removed by a method of dipping the substrate 100 into a stripper in the form of a solution including hydro fluoro ether. In this regard, the first intermediate layer 220R is covered by the first blocking layer 291, and accordingly, when the first protective layer 410 (of FIG. 3) is removed, the first intermediate layer 220R is not exposed to the stripper while removing the first protective layer 410 (of FIG. 3).

Figure 5:
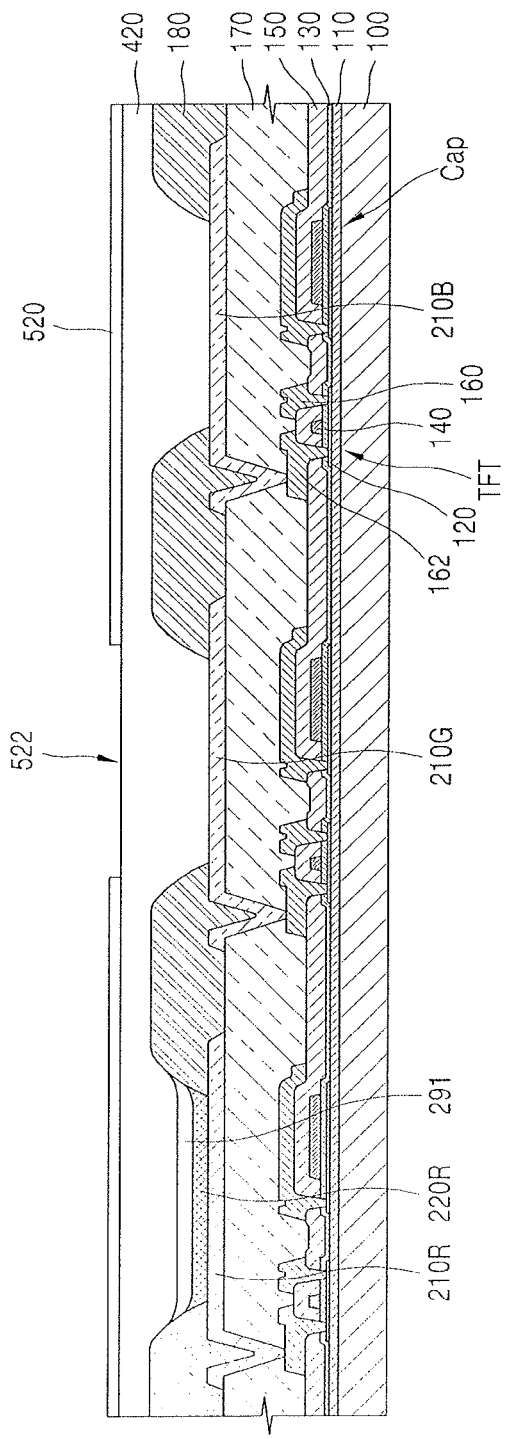
Figure 6:
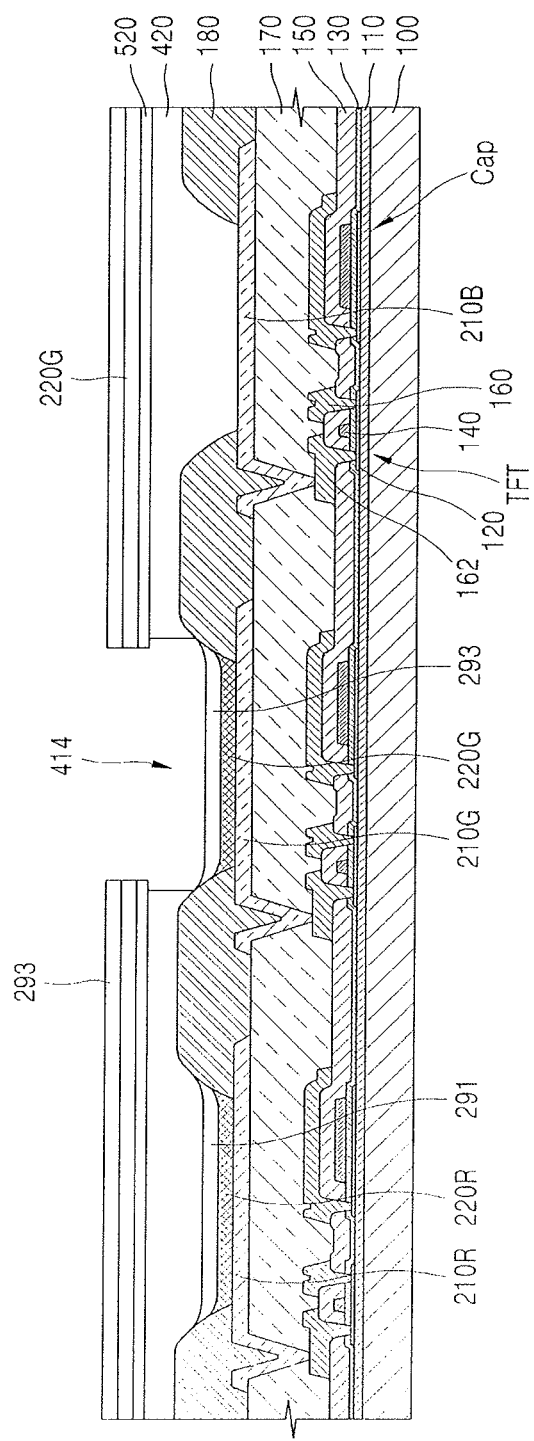

Next, as illustrated in FIGS. 5 and 6, the second protective layer 420 may be formed above the substrate 100 so as to cover the pixel electrodes 210R, 210G, and 210B. The second exposure portion 414 exposing the second pixel electrode 210G may be formed in the second protective layer 420, and then, the second intermediate layer 220G and the second blocking layer 293 may be formed over the second pixel electrode 210G.

In detail, the second protective layer 420 may include the same material as that of the first protective layer 410 (of FIG. 3). Also, the second exposure portion 414 may be formed by the same method used to form the first exposure portion 412. That is, the second exposure portion 414 may be formed by coating the second protective layer 420 with a second photosensitive resin layer 520, forming a second groove by patterning the second photosensitive resin layer 520 through a photolithography process, and then etching the second protective layer 420 via the second groove.

The second intermediate layer 220G and the second blocking layer 293 may be formed so as to correspond to the entire area of the substrate 100, and thus may also be formed over the second photosensitive resin layer 520. Also, the second blocking layer 293 may be larger than the second intermediate layer 220G. The second blocking layer 293 may include the same material as that of the first blocking layer 291.

Figure 7:
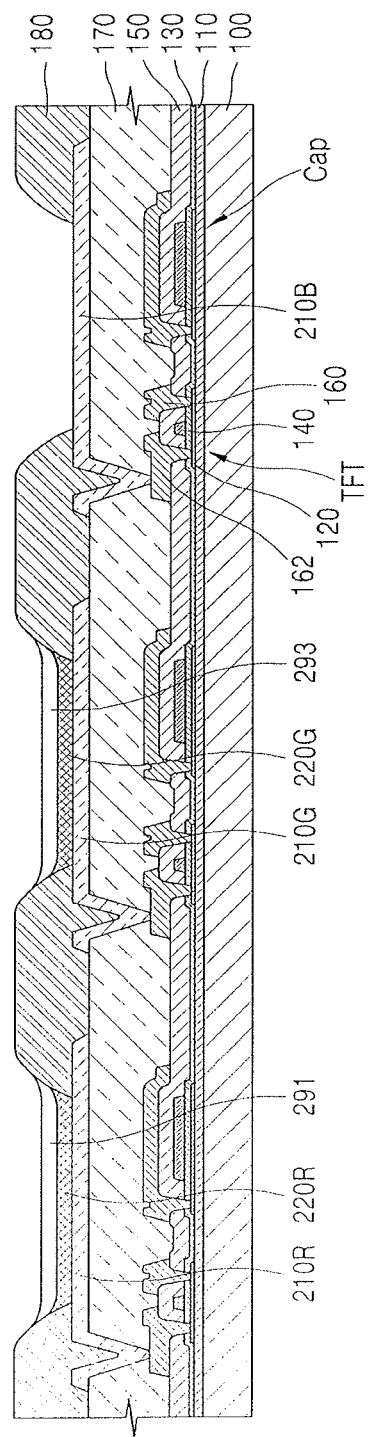

Next, as illustrated in FIG. 7, the second protective layer 420 (of FIG. 6) may be removed. The second protective layer 420 (of FIG. 6) may be removed by the same method used to remove the first protective layer 410 (of FIG. 3). In this regard, the first intermediate layer 220R and the second intermediate layer 220G are covered and protected by the first blocking layer 291 and the second blocking layer 293, respectively, and thus are not externally exposed during manufacturing processes.

Next, as illustrated in FIG. 8, the third protective layer 430 may be formed above the substrate 100 so as to cover the pixel electrodes 210R, 210G, and 210B. The third exposure portion 416 exposing the third pixel electrode 210B may be formed in the third protective layer 430, and then, the third intermediate layer 220B may be formed on the third pixel electrode 210B.

The third exposure portion 416 may be formed by the same method used to form the first exposure portion 412 and the second exposure portion 414. That is, the third exposure portion 416 may be formed by coating the third protective layer 430 with a third photosensitive resin layer 530, forming a third groove by patterning the third photosensitive resin layer 530 through a photolithography process, and then etching the third protective layer 430 via the third groove.

The third intermediate layer 220B may be formed so as to correspond to the entire area of the substrate 100, and thus may also be formed on the third photosensitive resin layer 530.

Figure 9:
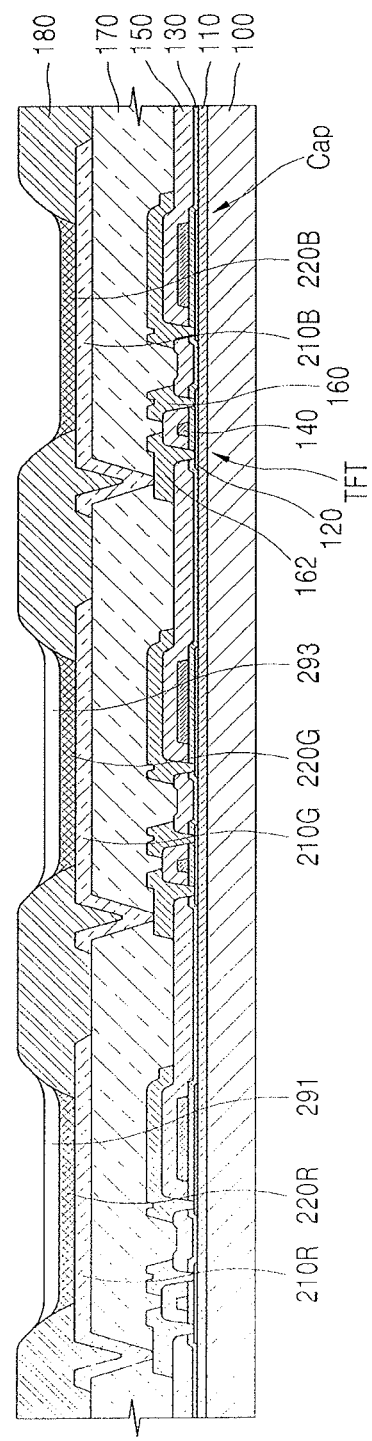
Figure 10:
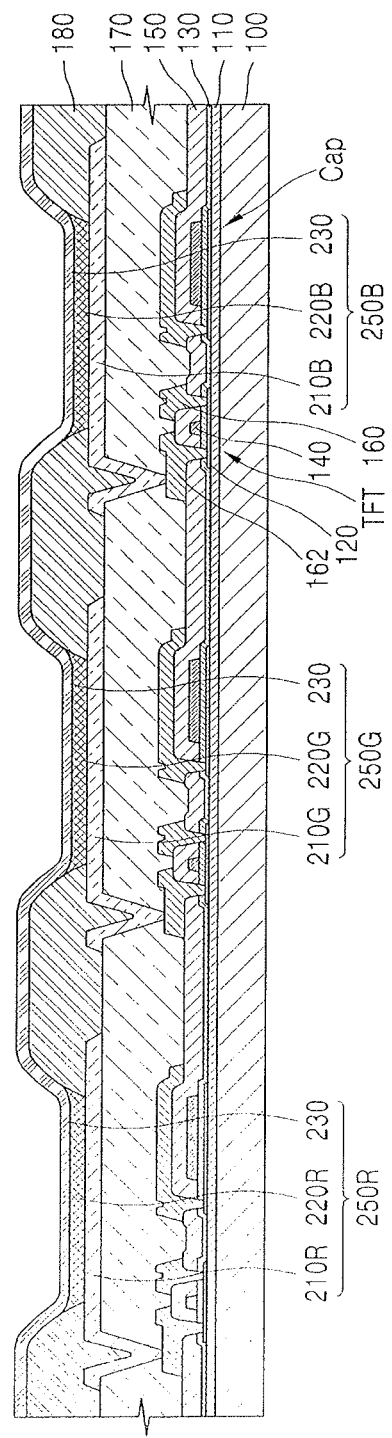

As illustrated in FIGS. 9 and 10, after the third intermediate layer 220B is formed, the third protective layer 430 (of FIG. 8) may be removed, the first blocking layer 291 and the second blocking layer 293 may be removed, and then, the opposite electrode 230 may be formed over the entire surface of the substrate 100.

The third protective layer 430 may be removed by the same method used to remove the first protective layer 410 (of FIG. 3) and the second protective layer 420 (of FIG. 6). In this regard, the first intermediate layer 220R and the second intermediate layer 220G are covered and protected by the first blocking layer 291 and the second blocking layer 293, respectively, and thus are not externally exposed during manufacturing processes. In a selective embodiment, a third blocking layer may be further formed on the third intermediate layer 220B. Accordingly, when the first intermediate layer 220R, the second intermediate layer 220G, and the third intermediate layer 220B are formed, external exposure of the first intermediate layer 220R, the second intermediate layer 220G, and the third intermediate layer 220B may be minimized, and thus, damage to the first intermediate layer 220R, the second intermediate layer 220G, and the third intermediate layer 220B may be prevented. Accordingly, reliability of the organic light-emitting display device 10 may increase.

The first blocking layer 291 and the second blocking layer 293 may be removed by various methods, e.g., thermal desorption, ion sputtering, mechanical polishing, or plasma oxidation. For example, the first blocking layer 291 and the second blocking layer 293 may be removed by nitrogen plasma treatment. The first blocking layer 291 and the second blocking layer 293 are self-assembled monolayers including at least one of the fluorine-based polymer and the hydrocarbon-based polymer as a chain, and including an organic-inorganic silane compound as a head group, and thus may be easily removed without residue remaining. Also, when the first blocking layer 291 and the second blocking layer 293 of the related art include ITO, a slip phenomenon of a driving voltage, i.e., a phenomenon in which an organic light-emitting device is not operated by an initial driving voltage and is driven by a higher voltage, may be prevented.

The opposite electrode 230 may be a transparent electrode or a reflective electrode. When the opposite electrode 230 is a transparent electrode, the opposite electrode 230 may have a layer including a metal having a low work function, e.g., Li, Ca, LiF/Ca, LiF/Al, Al, Ag, Mg, or a compound thereof, and a transparent conductive layer, e.g., ITO, IZO, ZnO, or $In_2O_3$. When the opposite electrode 230 is a reflective electrode, the opposite electrode 230 may have a layer including, e.g., Li, Ca, LiF/Ca, LiF/Al, Al, Ag, Mg, or a compound thereof. However, a structure and a material of the opposite electrode 230 is not limited thereto, and may be variously modified.

Referring to FIG. 1 again, a thin film encapsulation layer 300 encapsulating a display layer 200 and preventing intrusion of external oxygen and moisture, etc. into the display layer 200 may be formed on the opposite electrode 230.

The thin film encapsulation layer 300 may include at least one inorganic film 310 and 330 and at least one organic film 320. For example, as illustrated in FIG. 1, the thin film encapsulation layer 300 may include a first inorganic film 310, an organic film 320, and a second inorganic film 330 stacked on one another in this stated order. However, the thin film encapsulation layer 300 is not limited thereto, and may have various structures.

The first inorganic film 310 and the second inorganic film 330 may include at least one of, e.g., silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). The organic film 320 may include at least one of, e.g., an acrylic resin layer, a methacrylic resin layer, polyisoprene, a vinyl-based resin layer, an epoxy-based resin layer, a urethane-based resin layer, a cellulose-based resin layer, and a perylene-based resin layer.

Although FIG. 1 illustrates an example in which the thin film encapsulation layer 300 is on the opposite electrode 230, the present disclosure is not limited thereto. That is, the organic light-emitting display device 10 may include a sealing substrate instead of the thin film encapsulation layer 300. The sealing substrate may be attached to the substrate 100 by a sealing member, e.g., a sealing glass frit, and may block external moisture and air, etc.

By way of summation and review, according to one or more embodiments, a method of forming an organic light-emitting display device includes sequentially forming intermediate layers on respective pixels electrodes, while forming a blocking layer on each of the intermediate layers to prevent damage to each covered intermediate layer during formation of subsequent intermediate layers. Accordingly, damage to an intermediate layer including an emission layer may be prevented during a process of manufacturing an organic light-emitting display device. Thus, reliability of the organic light-emitting display device may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light-emitting display device, the method comprising:
    forming a plurality of pixel electrodes on a substrate;
    forming a first protective layer over the plurality of pixel electrodes, such that a first exposure portion through the first protective layer exposes a first pixel electrode of the plurality of pixel electrodes;
    forming a first intermediate layer and a first blocking layer on the first pixel electrode, such that the first blocking layer covers the first intermediate layer;
    removing the first protective layer;
    forming a second protective layer over the plurality of pixel electrodes, such that a second exposure portion through the second protective layer exposes a second pixel electrode of the plurality of pixel electrodes;
    forming a second intermediate layer and a second blocking layer on the second pixel electrode, such that the second blocking layer covers the second intermediate layer;
    removing the second protective layer;
    forming a third protective layer over the plurality of pixel electrodes, such that a third exposure portion through the third protective layer exposes a third pixel electrode of the plurality of pixel electrodes;
    forming a third intermediate layer on the third pixel electrode; and
    removing the third protective layer and the first and second blocking layers,
    wherein each of the first blocking layer and the second blocking layer includes a self-assembled monolayer.

2. The method as claimed in claim 1, wherein the first exposure portion is formed by coating the first protective layer with a first photosensitive resin layer, forming a first groove by partially exposing and etching the first photosensitive resin layer, and then etching the first protective layer via the first groove.

3. The method as claimed in claim 2, wherein a size of the first exposure portion is greater than that of the first groove.

4. The method as claimed in claim 1, further comprising forming an opposite electrode on the first intermediate layer, the second intermediate layer, and the third intermediate layer.

5. The method as claimed in claim 4, further comprising forming a thin film encapsulation layer on the opposite electrode.

6. The method as claimed in claim 1, further comprising forming a plurality of thin film transistors electrically connected to the plurality of pixel electrodes on the substrate.

7. The method as claimed in claim 1, wherein forming the first protective layer includes forming the first exposure portion to expose only the first pixel electrode, while the second and third pixel electrodes are covered by the first protective layer.

8. A method of manufacturing an organic light-emitting display device, the method comprising:
    forming a plurality of pixel electrodes on a substrate;
    forming a first protective layer over the plurality of pixel electrodes, such that a first exposure portion through the first protective layer exposes a first pixel electrode of the plurality of pixel electrodes;
    forming a first intermediate layer and a first blocking layer on the first pixel electrode, such that the first blocking layer covers the first intermediate layer;
    removing the first protective layer;
    forming a second protective layer over the plurality of pixel electrodes, such that a second exposure portion through the second protective layer exposes a second pixel electrode of the plurality of pixel electrodes;
    forming a second intermediate layer and a second blocking layer on the second pixel electrode, such that the second blocking layer covers the second intermediate layer;
    removing the second protective layer;
    forming a third protective layer over the plurality of pixel electrodes, such that a third exposure portion through the third protective layer exposes a third pixel electrode of the plurality of pixel electrodes; and
    forming a third intermediate layer on the third pixel electrode,
    wherein each of the first blocking layer and the second blocking layer includes a self-assembled monolayer, and
    wherein the self-assembled monolayer includes a chain with a head group, the chain including at least one of a fluorine-based polymer and a hydrocarbon-based polymer, and the head group including an organic-inorganic silane compound.

9. The method as claimed in claim 8, wherein the fluorine-based polymer includes at least one of perfluoropolyether, vinylidene fluoride, tetrafluoroethylene, hexafluoropropylene, and chlorotrifluoroethylene, and the hydrocarbon-based polymer comprises at least one of octadecyltrichloro and dichlorodimethyl.

10. The method as claimed in claim 8, wherein the organic-inorganic silane compound includes at least one functional group of an amino group, a vinyl group, an epoxy group, an alkoxy group, a halogen group, a mercapto group, and a sulfide group.

11. The method as claimed in claim 8, wherein forming the first blocking layer and the second blocking layer includes vacuum-depositing a blocker on each of the first intermediate layer and the second intermediate layer, the blocker being formed by polymerizing and condensing the at least one of the fluorine-based polymer and the hydrocarbon-based polymer with the organic-inorganic silane compound.

* * * * *